United States Patent [19]

Brunner et al.

[11] Patent Number: 4,983,833
[45] Date of Patent: Jan. 8, 1991

[54] DEVICE FOR THE DETECTING OF CHARGED SECONDARY PARTICLES

[75] Inventors: Matthias Brunner, Kirchheim; Ralf Schmid; Michael Regula, both of Munich, all of Fed. Rep. of Germany

[73] Assignee: Siemens Aktiengesellschaft, Berlin and Munich, Fed. Rep. of Germany

[21] Appl. No.: 393,221

[22] Filed: Aug. 14, 1989

[30] Foreign Application Priority Data

Nov. 21, 1988 [DE] Fed. Rep. of Germany ....... 3839316

[51] Int. Cl.$^5$ .......................... G01N 23/00; H01J 3/14
[52] U.S. Cl. ..................................... 250/397; 250/310
[58] Field of Search ............... 250/309, 310, 397, 398, 250/396 ML

[56] References Cited

U.S. PATENT DOCUMENTS

| | | | |
|---|---|---|---|
| 4,658,136 | 4/1987 | Ohtaka et al. | 250/310 |
| 4,658,137 | 4/1987 | Garth et al. | 250/310 |
| 4,769,543 | 9/1988 | Plies | 250/310 |
| 4,779,046 | 10/1988 | Rouberoi et al. | 250/310 |

FOREIGN PATENT DOCUMENTS 0259907 3/1988 European Pat. Off. .
3590146 10/1985 Fed. Rep. of Germany .
58-35854 3/1983 Japan .

*Primary Examiner*—Bruce C. Anderson
*Attorney, Agent, or Firm*—Hill, Van Santen, Steadman & Simpson

[57] ABSTRACT

A device for the detection of secondary electrons triggered at a large-area specimen is composed of a tube electrode arranged concentrically relative to the primary beam axis of an electron beam measuring device and an electrostatic or magnetic octupole for the deflection of the secondary electrons in the direction of a detector. An opposing electrical field is formed by two hemispherically shaped electrodes. The tube electrode which is arranged immediately above the specimen, and preferably has a circular cross-sectional area, whereby the tube diameter is selected larger than the diagonal of the specimen. An electrical extraction field that is rotationally symmetric with respect to the primary beam axis is generated inside the device. The secondary particles will be accelerated in the direction of the deflection unit.

In the electrical extraction field, the particles are detected independently of the location of the respective measuring point inside the scanned field that is 20×20 cm$^2$ in size.

13 Claims, 3 Drawing Sheets

DEVICE FOR THE DETECTING OF CHARGED SECONDARY PARTICLES

BACKGROUND OF THE INVENTION

1. Field of the Invention

The invention relates to a device for the detection of charged secondary particles which are generated by a primary particle beam incident on a specimen.

2. Description of the Prior Art

When a particle beam is projected on a specimen, secondary particles are emitted due to an interaction with the primary particles of the solid body. The energy and angular distribution of these secondary particles are dependent, interalia, on the chemical and physical composition present in the interaction region which is on the surface of the specimen, and on the distribution of the potential present in the specimen. The secondary particles which are triggered are usually sensed by a detector arranged laterally above the specimen. These secondary particles are of particular significance for imaging and measuring potentials in scanning electron microscopes. Prior art devices, such as German OS 35 90 146, produce an undesirably high asymmetrical extraction field, which will permit the quantitative measurements of potential to be made only within an extremely small scan field.

It is known to use a plurality of detectors arranged symmetrically relative to the primary beam axis to guarantee that the detection of the secondary electrons is independent of the trigger point and emission angle. Such a multi-detector system is disclosed in JP-A-58 35 854. These systems have the disadvantage of a noise signal which will be generated by backscattered electrons. This noise signal will be superimposed on the secondary electron signal causing the detector to receive a signal that is multiplied in comparison to individual detectors. In these detector systems the scan field that is available for quantitative measurements is limited to a few mm$^2$.

SUMMARY OF THE INVENTION

An object of the invention is to provide a secondary particle detector in which secondary particles triggered on a specimen will be successfully detected regardless of the location of the measuring point within a large-area scan field. In particular, the device should be suitable for electron beam testing of printed circuit boards.

An advantage of the invention is that there will be no location-dependent disturbances caused by the detector geometry which might be superimposed on the measured signal. Moreover, the signal contributions of backscattered primary electrons are considerably reduced.

DETAILED DESCRIPTION OF THE PRESENTLY PREFERRED EMBODIMENTS

Figure 1:
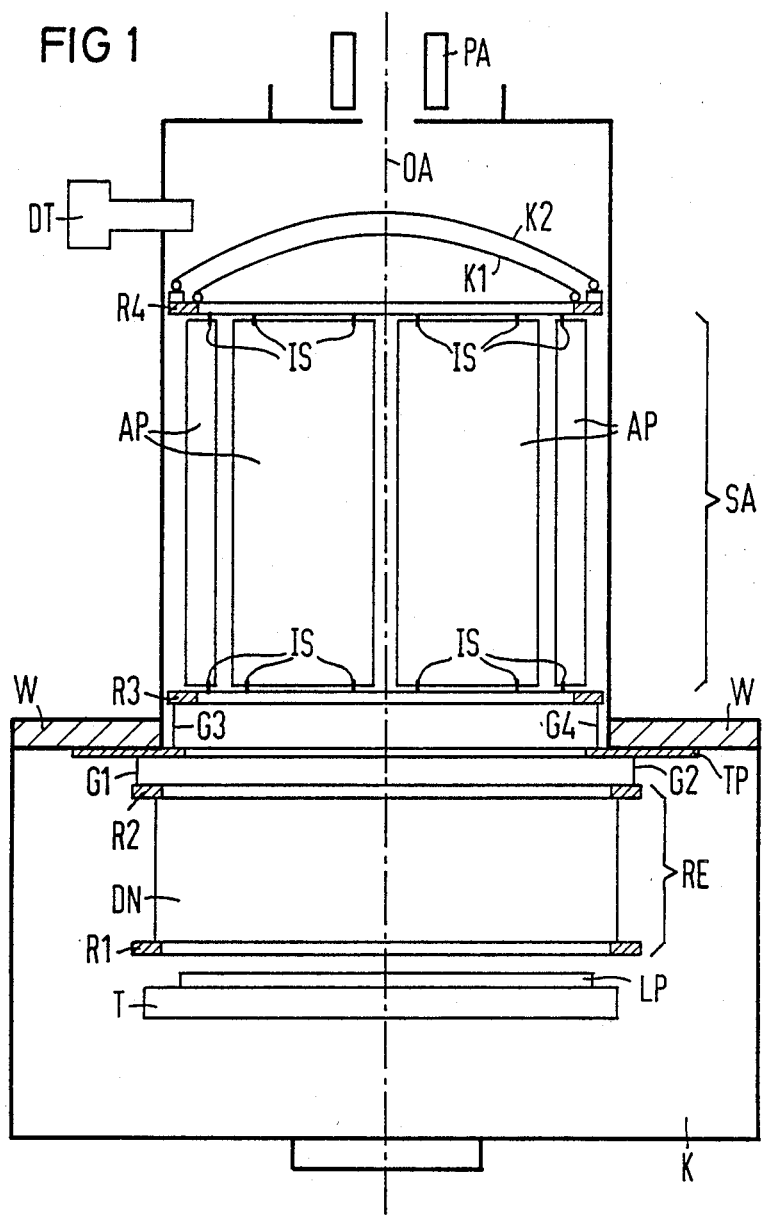
FIG. 1 is a schematic side view of a device for the detection of secondary electrons constructed in accordance with the principles of the present invention.

The device for the detection of secondary electrons schematically shown in FIG. 1 can be used in electron beam measuring equipment for testing printed circuit boards and wiring modules. It replaces the conventional detector system and is arranged above the printed circuit board LP to be tested. The printed circuit board is placed in an evacuated chamber K on a table T that can be aligned relative to the primary beam axis OA. The particle beam for charging the line networks and for reading the distribution of potential is formed according to the network geometry and is usually generated in a modified scanning electron microscope whose column contains a beam generator, one or more condenser lenses, an objective lens and deflection system PA for positioning the primary electron beam within the scanned field that can be as large as 20×20cm$^2$ in size. The secondary electrons that are triggered at the respective measuring points are accelerated in the direction of the deflection unit SA which is arranged above a tube electrode RE. The particles are accelerated into an electrical field that is rotationally symmetrical with respect to the primary beam axis OA. The secondary particles are decelerated in an opposing electrical field generated between two hemispherical-like electrodes K1 and K2 and are extracted in the direction of the detector DT which is composed of a scintillator held at a high, positive potential of 10 kV, and which includes a light conductor and a photomultiplier.

The tube electrode RE, which is arranged directly above the printed circuit board LP, is symmetric relative to the primary beam axis OA and preferably has a circular cross-section, whereby the tube diameter is selected somewhat larger than the diagonal of the printed circuit board. The cross-sectional area of tube electrode RE can exhibit an arbitrary shape. The tube diameter, however, must then be selected such that the electrical field within the scan field continues to maintain rotational symmetry with respect to the primary beam axis OA. This tube electrode is placed at ground or at a low negative potential $U_{RE}$ which may be between $-5V$ and $-50V$. It is composed of two aluminum carrier rings R1 and R2 connected by a plurality of threaded rods and of a stainless steel wire net DN (wire diameter $d \approx 0.25$ mm, mesh width $w \approx 1$ mm) which is held in by guide rails. Threaded rods G1 through G4 are used to fasten the tube electrode RE and the deflection unit SA to the aluminum plate TP which is screwed into the chamber wall W. Each of these threaded rods G1 through G4 are connected by bushings and washers of polymerized polystyrol to the carrier rings R1 and R2 in an insulated fashion.

An electrical octupole element is arranged symmetrically relative to the carrier beam axis and serves as a deflection unit SA. The frame of the deflection unit, which is composed of two aluminum rings R3 and R4, as well as the aluminum plate TP are placed at a potential $U_A$ of, for example, $U_A = 1$ through 3 kV. Strips IS of polymerized polystyrol are attached to the narrow side of each of the deflection plates AP of the octopole. These strips IS are fitted into a guide channel present in the carrier rings R3 and R4. In order to increase the mechanical stability, the carrier rings R3 and R4 are interconnected to one another via threaded rods.

Figure 2:
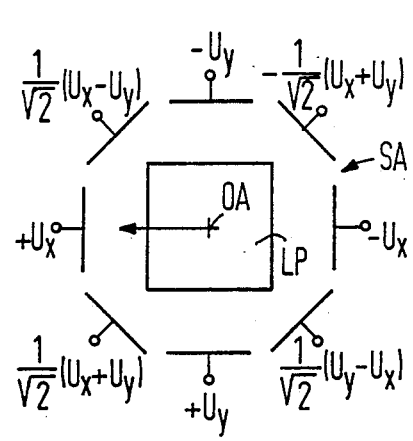
FIG. 2 is a schematic plan view of an electrostatic octupole for the device of FIG. 1.

In order to deflect the secondary electron particles generated in the rotationally symmetrical electrical extraction field in the direction of the detector DT, which is arranged laterally above the octupole SA, the deflection plates AP are preferably composed of a wire network and are charged with the potentials recited in FIG. 2. The positive extraction potential $U_A$ is also superimposed on the respective deflection potentials $U_x$ or $U_y$.

After the deflection in the field of electrostatic octupole SA (the deflection direction is indicated by an arrow in FIG. 2), the secondary electrons pass through an opposing electrical field generated between two approximately hemispherical electrodes K1 and K2. These electrodes K1 and K2 arranged on the upper carrier ring R4 are each composed of a hard-soldered wire ring and of a wire weave having a mesh width of about 1.6 mm and a wire thickness of about 0.22 mm. While the electrode K1 connected to the carrier ring R4 in conductive fashion is held at the extraction potential $U_A$, the net electrode K2 is placed at a potential $U_G$ between −15 volts and +15 volts. The K1 and K2 electrode arrangement will allow only secondary particles having energies above a threshold, prescribable with the potential $U_G$, to reach detector DT (resulting in an improvement of the voltage contrast signal).

Figure 3:
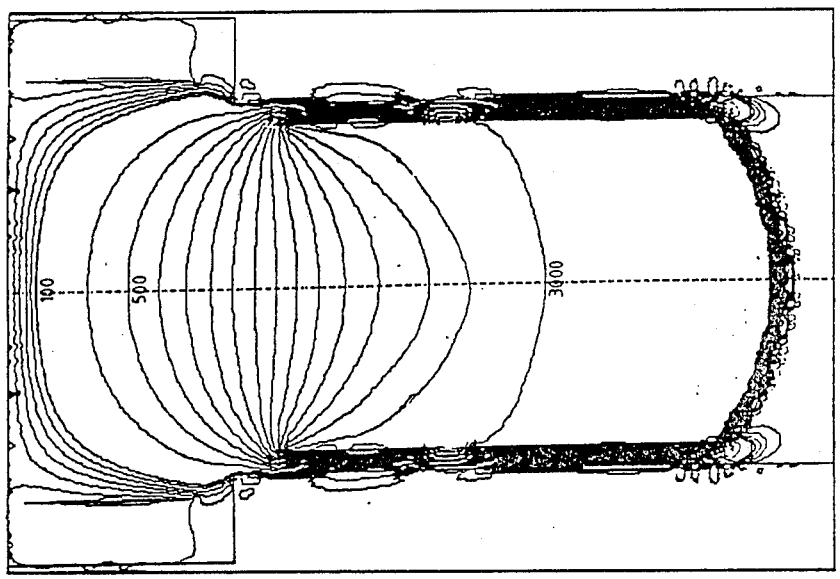
FIG. 3 is a graph showing the voltage distribution within the device of FIG. 1.

FIG. 3 shows the calculated field distribution inside the device of the invention. It was assumed that the tube electrode RE and the deflection unit SA lie at the potential of $U_{RE}=-18$ volts and $U_A=3$ kV respectively ($U_x=U_y=U_G=0$ volts). As a result, the extraction field immediately above the specimen under test will be uniform.

Figure 4:
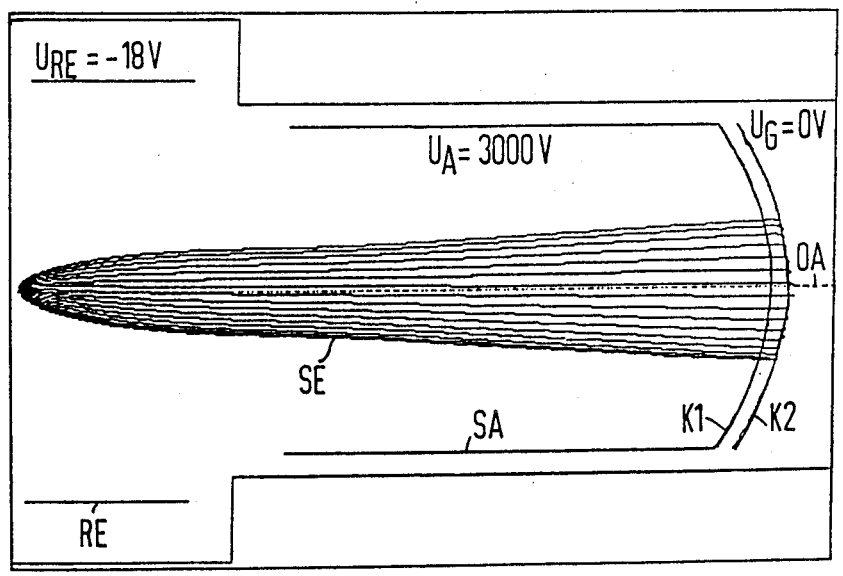
FIG. 4 is a graph showing the calculated secondary particle paths for the case wherein the secondary electrons start in the center of the printed circuit board.
Figure 5:
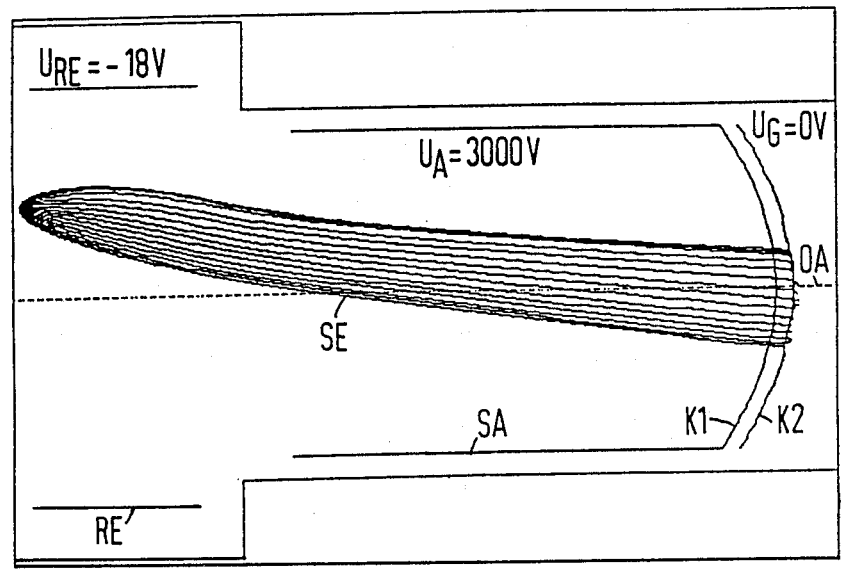
FIG. 5 is a graph showing the calculated secondary particle path for the case wherein secondary electrons start on a diagonal about 10 cm outside the center of the printed circuit board.

The focusing affect of the extraction field that is rotationally symmetrical with respect to the primary beam axis OA is shown in FIGS. 4 and 5. These respectively show the calculated trajechories for that case wherein the secondary electrons SE start in the center of the printed circuit board (FIG. 4) or, on the diagonal about 10 cm outside the center with an energy of 20 eV and an angle between 40° and 180° with respect to the plane of the printed circuit board (FIG. 5). Independently of the trigger location, the secondary electrons SE enter nearly perpendicularly into the opposing field generated between electrodes K1 and K2. It may also be seen that the secondary electrons SE emitted approximately perpendicularly relative to the primary axis OA are also accelerated in the direction of the deflection unit SA.

Figure 6:
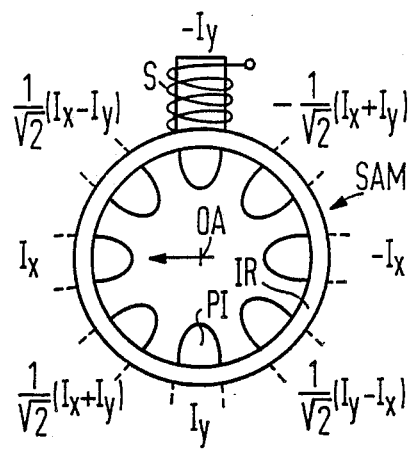
FIG. 6 is a plan view of a magnetic octopole for the deflection of secondary electrons having inner and outer pole shoes for pole elements, which can be used in the device of FIG. 1.

The invention is not limited to the exemplary embodiments that have been set forth above. Thus, it is possible to use a magnetic octupole SAM for the deflection of secondary electrons. As FIG. 6 shows, this octopole SAM is composed of eight inner pole pieces which PI which are placed at the potential $U_A$ and which are separated from their respective outer pole pieces by insulated ring IR. These outer pole pieces are placed at ground potential and are each provided with an excitation winding S. For the deflection of the secondary electrons in the direction indicated by the arrow, the currents that are respectively indicated must flow in the excitation windings S.

The described device can also be used for the detection of ions or photoelectrons when the specimen under test is scanned with an ion beam or laser beam.

We claim:

1. A charged secondary particle detection device for use in an apparatus having a primary beam focused on a specimen for generating said secondary particles, said detection device comprising:

means for detecting secondary particles;
   means for deflecting said secondary particles onto said menas for detecting said means for deflecting having an axis of symmetry;
   means for charging said means for deflecting with a deflecting potential and for superimposing a second potential on said deflection potential, said second potential acting to accelerated the secondary particles;
   a tube electrode disposed below said means for deflecting in the direction of travel of said primary beam and having an axis of symmetry which is parallel with the axis of symmetry of said means for deflecting; and
   means for applying a first potential to said tube electrode, said first potential being lower in amplitude than said second potential.

2. A charged secondary particle detection device as in claim 1, wherein the deflection unit comprises a multipole element.

3. A charged secondary particle detection device as claimed in claim 2, wherein the electrostatic or magnetic multipole element comprises eight poles.

4. A charged secondary particle detection device as in claim 2, wherein each of said pole elements are aluminum plates that are rectangular in shape.

5. A charged secondary particle detection device as in claim 4, further comprising strips of polystyrol attached to a short side of each of said aluminum plates to mount said plates to said upper and lower carrier elements.

6. A charged secondary particle detection device as in claim 1, wherein the deflection unit comprises a electrostatic multipole element.

7. A charged secondary particle detection device as in claim 1, wherein the deflection unit comprises a magnetic multipole element.

8. A charged secondary particle detection device as in claim 7, wherein each of said pole elements are comprised of an inner and outer pole piece, each of said outer pole pieces are provided with an excitation winding and held at ground potential.

9. A charged secondary particle detection device as in claim 8, further comprising an insulator ring disposed to insulate said inner pole pieces from said outer pole pieces.

10. A charged secondary particle detection device as claimed in claim 1, wherein the deflection unit further comprises upper and lower carrier elements and a second electrode mounted on said upper carrier element.

11. A charged secondary particle detection device as in claim 10, wherein said second potential is positive relative to said first potential.

12. A charged secondary particle detection device as in claim 10, further comprising a third electrode mounted above said second electrode, means for insulating said third electrode from said upper carrier element, said third electrode being at a potential selected to create an electrical field between said second and third electrode to decelerate the secondary particles passing therethrough.

13. A charged secondary particle detection device as in claim 12, wherein said second and third electrodes are hemispherical-like in shape.

* * * * *